(12) United States Patent
Kuhmann et al.

(10) Patent No.: US 8,729,591 B2
(45) Date of Patent: May 20, 2014

(54) OPTO-ELECTRONIC DEVICE PACKAGE WITH A SEMICONDUCTOR-BASED SUB-MOUNT HAVING SMD METAL CONTACTS

(75) Inventors: Jochen Kuhmann, Berlin (DE); Lior Shiv, Hilleroed (DK)

(73) Assignee: TSMC Solid State Lighting Ltd., HsinChu (TW)

( * ) Notice: Subject to any disclaimer, the term of this patent is extended or adjusted under 35 U.S.C. 154(b) by 450 days.

(21) Appl. No.: 12/426,796

(22) Filed: Apr. 20, 2009

(65) Prior Publication Data

US 2010/0210045 A1    Aug. 19, 2010

Related U.S. Application Data

(60) Provisional application No. 61/152,382, filed on Feb. 13, 2009.

(51) Int. Cl.
*H01L 33/00* (2010.01)

(52) U.S. Cl.
USPC ............... 257/99; 257/100; 257/116; 438/22; 438/226; 438/222

(58) Field of Classification Search
USPC ............. 257/678, 99, 116; 438/106, 121
See application file for complete search history.

(56) References Cited

U.S. PATENT DOCUMENTS

| | | | |
|---|---|---|---|
| 4,808,260 A * | 2/1989 | Sickafus et al. | 216/2 |
| 6,531,328 B1 * | 3/2003 | Chen | 438/26 |
| 6,786,654 B2 * | 9/2004 | Kilian | 385/94 |
| 6,818,464 B2 | 11/2004 | Heschel | |
| 2006/0138436 A1 * | 6/2006 | Chen et al. | 257/98 |
| 2006/0208271 A1 * | 9/2006 | Kim et al. | 257/100 |
| 2006/0210234 A1 | 9/2006 | Shiv et al. | |
| 2007/0007540 A1 * | 1/2007 | Hashimoto et al. | 257/94 |
| 2007/0145404 A1 * | 6/2007 | Murayama et al. | 257/99 |
| 2007/0170450 A1 | 7/2007 | Murphy | |
| 2008/0006837 A1 * | 1/2008 | Park et al. | 257/98 |
| 2008/0076195 A1 | 3/2008 | Shiv | |
| 2008/0290353 A1 * | 11/2008 | Medendorp et al. | 257/89 |

OTHER PUBLICATIONS

Kulicke & Soffa Flip Chip Division, "Bumping Design Guide", Sep. 2003, pp. 1-46.
"High Density Interconnect & Wafer Level Packaging", Fraunhofer Inst. For Reliability & Microintegration IZM and the Technical University of Berlin, Jan. 2005, pp. 1-6.
Garrou, Dr. Philip, "Wafer-Level Packaging Has Arrived", IEEE Components, Packaging and Manufacturing Technologies Society—Semiconductor International, Oct. 1, 2000; pp. 1-8.

* cited by examiner

*Primary Examiner* — Thao X Le
*Assistant Examiner* — Eric Jones
(74) *Attorney, Agent, or Firm* — Haynes and Boone, LLP (57) ABSTRACT

Non-planar via designs for sub-mounts on which to mount a LED or other optoelectronic device include a continuous layer of metal to conduct the current from the front-side (e.g., LED side) to the backside (e.g., SMD side) through the via and to provide a sufficiently stable and reliable under bump metallization for SMD soldering. Each UBM can be structured so that it does not fully cover the sidewall surfaces of the via that forms the front-to-backside interconnect. In some implementations, each via structure for the feedthrough metallization extends to a respective side-edge of the sub-mount.

20 Claims, 7 Drawing Sheets

Reflections

Input:

| | | | |
|---|---|---|---|
| Sidewall angle | | 54.74 | deg |
| via bottom width | w | 90.00 | μm |
| max. height for light incident (via height) | y1 | 190.00 | μm |

Output:

| | | | |
|---|---|---|---|
| X-extend on sidewall (horizontally) | x1 | 134.33 | μm |
| max. reflection from point of incident into cavity (horizontally) | x2 | 537.14 | μm |
| real length on sidewall | | 232.69 | μm |
| | x3 | 312.81 | |
| | sh | 180.58 | |
| | xh | 104.25 | |
| | yh | 147.45 | | yh ≥ 147 μm

OPTO-ELECTRONIC DEVICE PACKAGE WITH A SEMICONDUCTOR-BASED SUB-MOUNT HAVING SMD METAL CONTACTS

CROSS-REFERENCE TO RELATED APPLICATION(S)

This application claims the benefit of priority of priority of U.S. provisional patent application Ser. No. 61/152,382, filed on Feb. 13, 2009, the contents of which are incorporated herein by reference.

BACKGROUND

The present disclosure relates to an opto-electronic device package with a semiconductor sub-mount having surface mounting device (SMD) metal contacts.

Optoelectronic devices, such as light emitting diodes (LEDs), have various applications in consumer electronics. High-brightness LEDs, for example, can be used as light sources in space-limited applications where thermal management is important. The LEDs are optimized for display backlighting and illumination in automotive and transport, consumer, and general applications. Typical end-products include mobile telephone displays, flashes for cameras, retail and window displays, emergency lighting and signs, household appliances, and automotive instrument panels and exterior lighting, such as brake lights and turn signals.

Some high brightness LED packages are ceramic-based or employ plastic leadless chip carriers (PLCCs). Silicon-based packages, however, can facilitate manufacturing of the packages by leveraging mature silicon processing techniques. In one example, a LED chip is mounted within a recess of a silicon sub-mount. Feedthrough metallization extends through vias from the front-side recess to SMD contacts on the backside of the sub-mount and provides electrical connections for the LED's anode and cathode terminals. The SMD contacts allow the package to be mounted, for example, on a printed circuit board (PCB).

Formation of the backside contacts for the foregoing non-planar sub-mount typically requires a solder dam to restrain solder from enclosing the via cavities and thus forming larger voids inside the cavity area when the LED package is mounted on the PCB. The effect is aggravated by the fact that the solder provided by the PCB typically contains a large amount (e.g., 10-15 wt %) of flux that needs to outgas during soldering operations.

For non-planar backside contacts, a considerable amount of gas is likely to be entrapped during this process because the via structure comprises a relatively large enclosed volume. The voids formed can lead to difficulties in process repeatability because the amount of voiding varies statistically. The voids also can pose a considerable threat during thermal cycling. The gas-filled voids can expand during heating and potentially cause stress of the metallization system (e.g., solder and solderable metallization), which can lead, in some cases, to component failure (e.g., increased electrical resistance) as the result of partial or full delamination.

Another problem addressed by the present disclosure is that depositing a solder dam typically requires a physical vapor deposition (PVD) process for the metallization of the SMD-side of the sub-mount. It has been observed that the metal layers are considerably thinner inside the vias compared to the flat surface of the SMD side. In some cases, the metal thicknesses are up to 50% thinner. Thus, thicker metal deposition is required to circumvent full consumption of the metal layers during soldering inside the vias. However, PVD processes produce metal layers with a considerable amount of stress, so that a thicker layers of metal (e.g., by a factor of 2) may be difficult to achieve.

In addition, some designs (e.g., those that include a solder dam formed by a metal that is contained in a thin film metal stack) may require an additional mask for structuring a metal stack that includes a solder dam. Likewise, designs that use a photo-structurable polymer such as benzocyclo-butene (BCB) typically require additional masks for the BCB layers and for structuring the SMD pads or under bump metallization (UBM) (i.e., the metal stack that is deposited under the bump as part of the solder bumping process and typically has the combined features of adhesion layer, diffusion barrier, wetting layer and oxidation protection layer).

SUMMARY

The details of one or more implementations of the invention are set forth in the description below and the accompanying drawings. Various aspects of the invention are set forth in the claims.

For example, in one aspect, a non-planar via design includes a continuous layer of metal to conduct the current from the front-side (e.g., LED side) to the backside (e.g., SMD side) through the via and to provide a sufficiently stable and reliable UBM for SMD soldering. In some implementations, each UBM is structured so that the UBM does not fully cover all the sidewall surfaces of each via that forms the front-to-backside interconnect. In other implementations, each via structure for the feedthrough metallization extends to a respective side-edge of the sub-mount.

In some implementations, the disclosed design can help ensure that solder from the PCB, where the solder typically is provided in the form of solder paste, does not fully enclose the volume defined by the via cavity when the LED package or other package is mounted to a PCB. Consequently the flux contained in the solder can evaporate during the soldering process, and the solder is less likely to form voids. Thus, in some implementations, the disclosed designs can help prevent excessive void formation in conjunction with non-planar SMD contacts, can help reduce reliability risks correlated to void formation and can provide a reduction in mask steps which can lead to lower manufacturing costs and increased device yield.

Other features and advantages will be apparent from the following detailed description, the accompanying drawings, and the claims.

DETAILED DESCRIPTION

As illustrated in FIGS. 1, 2, 3, 4 and 5, a sub-mount 10 for an optoelectronic device, such as a LED chip, includes a semiconductor (e.g., silicon) substrate 12. The substrate has an overall thickness (t), for example, in the range of 350 µm-700 µm, and preferably in the range of 400 µm-600 µm. The LED chip can be mounted on a thin membrane portion of the substrate at the bottom of a recess in the front-side surface of the substrate 12. The sub-mount can be fabricated, for example, in a wafer-level batch process using standard 4-inch to 8-inch diameter silicon wafers.

Figure 1:
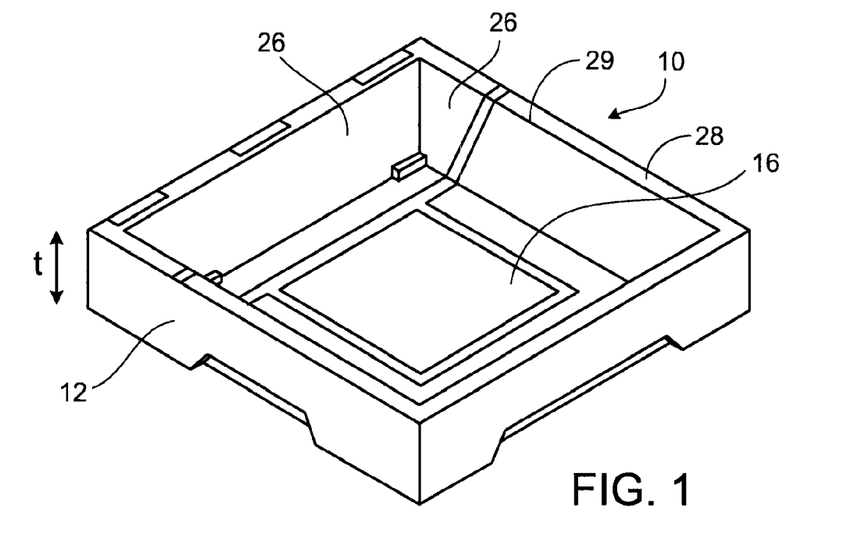
FIG. 1 is a front-side perspective view showing an example of a sub-mount.
Figure 2:
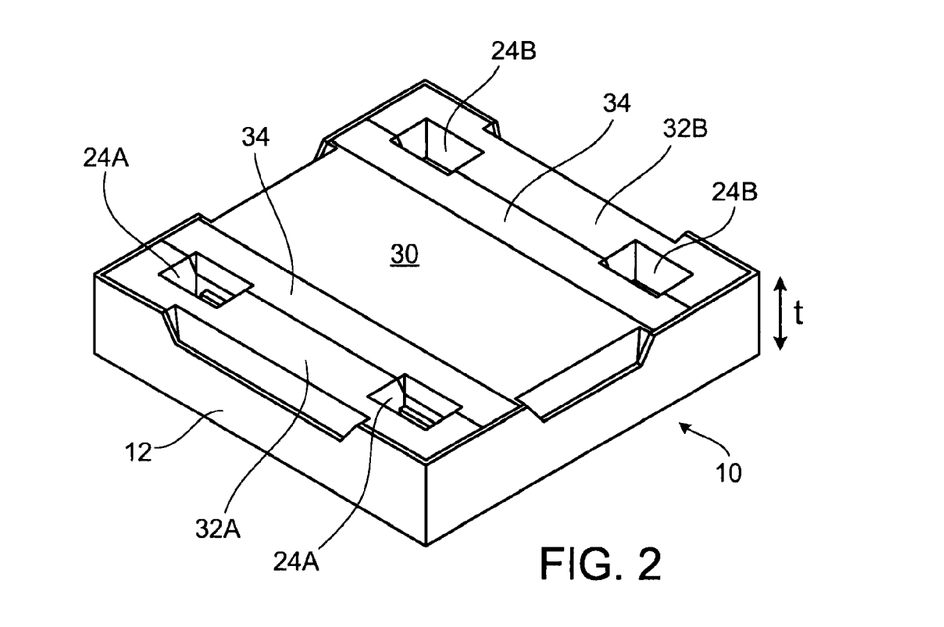
FIG. 2 is a back-side perspective view of the sub-mount of FIG. 1.
Figure 3:
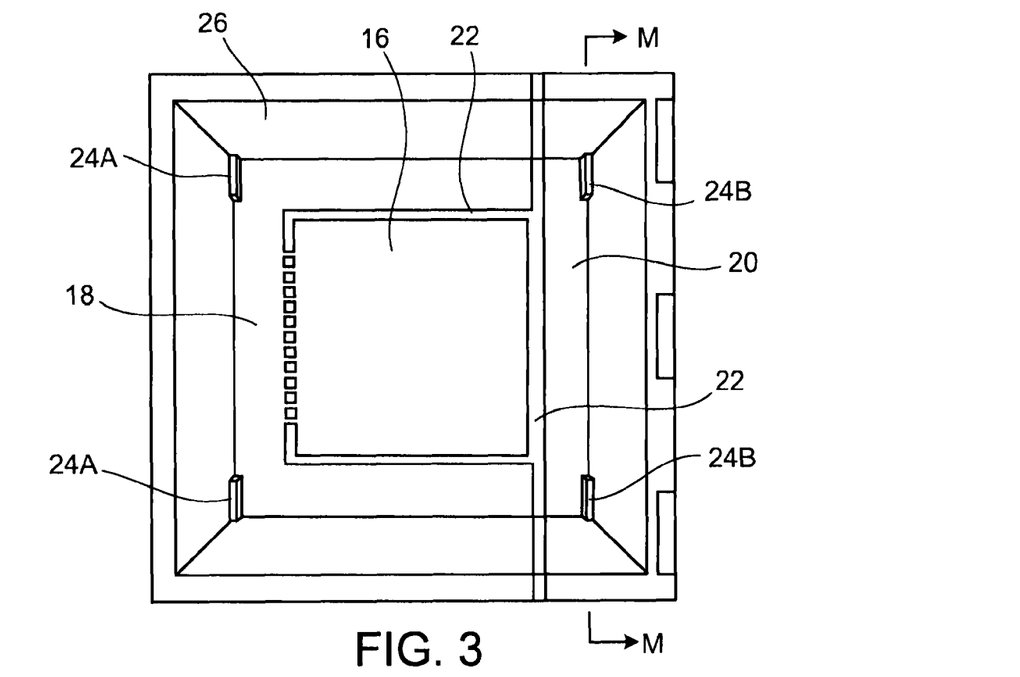
FIG. 3 is top view of the sub-mount of FIG. 1.

As shown in FIGS. 1 and 3, the front-side of the sub-mount 10 includes a die attach pad 16 on which the LED chip (or other optoelectronic chip) can be mounted. The die attach pad 16 is electrically connected to a first contact pad (e.g., an anode pad) 18 on the front-side surface of the substrate 12. A second contact pad (e.g., a cathode pad) 20 also is located on the front-side surface of the substrate 12. Thus, each of the pads 16, 18, 20 is located within the recess in the front-side surface of the substrate 12. Gold or silver, for example, can be used as the metallization for the die attach pad 16 as well as the anode and cathode pads 18, 20. Isolation regions (e.g., silicon oxide ($SiO_2$)) 22 provide electrical isolation between the pads.

When a LED chip is mounted on the die attach pad 16, an anode terminal at the bottom of the LED chip is in electrical contact with the die attach pad, which, in turn, is electrically connected to the anode pad 18. A cathode terminal at the top of the LED chip can be electrically connected to the cathode pad 20 by way of a wire bond, for example. The sidewalls 26 of the recess are metallized to provide a reflective surface so as to increase the amount of light directed out of the package. Solder dams can be used to prevent solder from flowing onto other areas during fabrication.

As illustrated in FIGS. 1-5, via structures 24A, 24B extend from the bottom of the recess on the front-side (i.e., LED side) to the back-side (i.e., SMD side) of the substrate 12. Feedthrough metallization in the via structures 24A provides electrical through-wafer interconnections between the anode pad 18 on the front-side of the sub-mount 10 to a respective SMD pad located on the back-side of the sub-mount. Likewise, feedthrough metallization in the via structures 24B provides electrical through-wafer interconnections between the cathode pad 20 on the front-side of the sub-mount 10 to a respective SMD pad located on the back-side of the sub-mount. In the illustrated example, two via structures 24A are provided for electrical connection from the anode 18, and two via structures 24B are provided for electrical connection from the cathode 20. In some implementations, a single via structure for the anode connection and a single via structure for the cathode connection may be sufficient. However, using multiple via structures with feedthrough metallization for each of the anode and cathode can increase the amount of current that can be handled.

Figure 4:
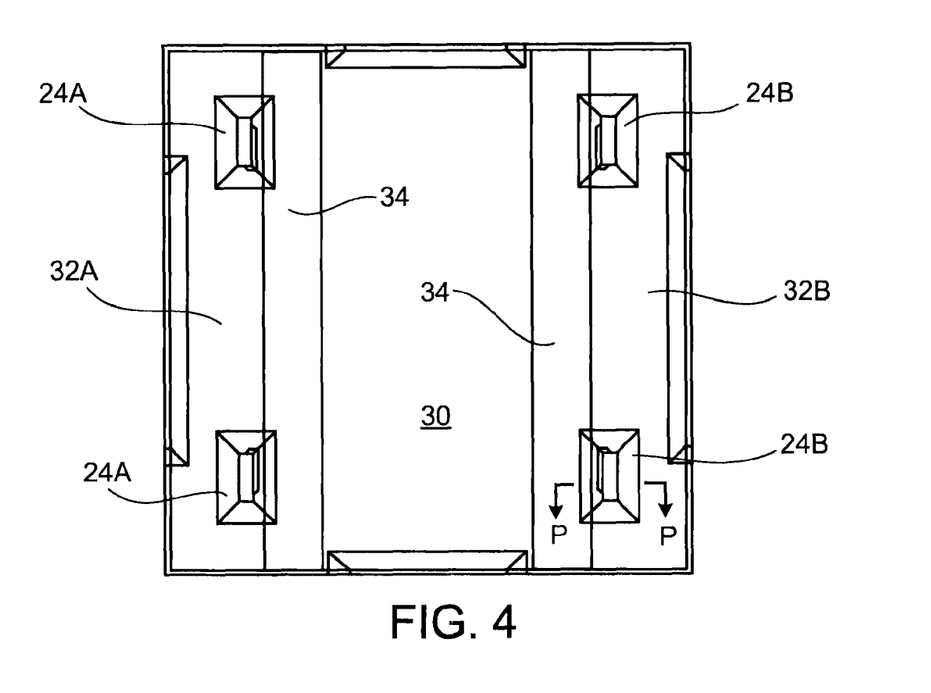
FIG. 4 is a bottom view of the sub-mount of FIG. 1.
Figure 5:
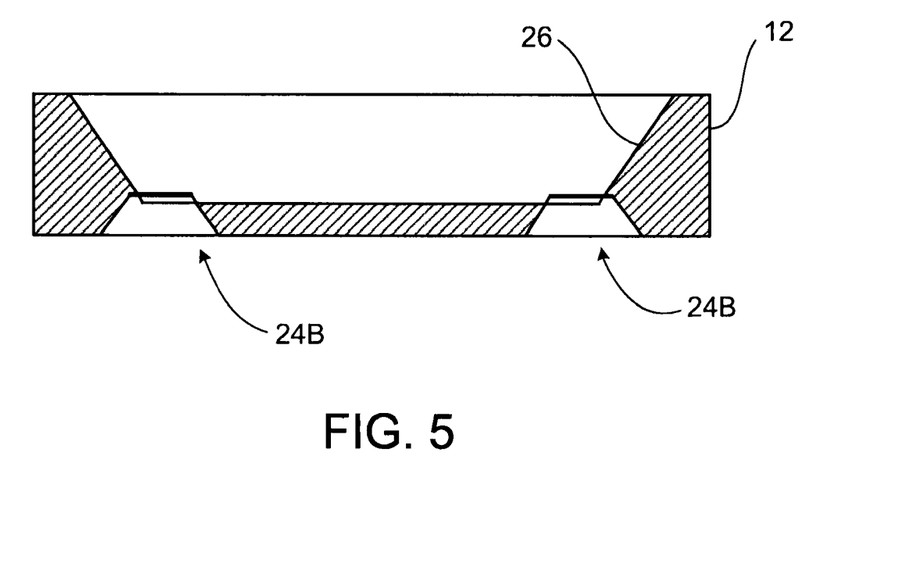
FIG. 5 is a cross-sectional view taken along lines M-M of FIG. 3.

FIG. 4 illustrates an example of the back-side of the sub-mount 10 (i.e., the SMD side), which includes a thermal pad 30 for heat transfer away from the LED chip. The thermal pad 30 can be formed, for example, of solderable metallization suitable for, e.g., tin/silver alloy. The via structures 24A, 24B with the feedthrough metallization are visible at the SMD side as well (see also FIG. 5). Regions of solderable metal 32A, 32B, such as gold, nickel, copper or silver, for example, serve as leadless SMD contacts for the anode and cathode. In some implementations, electrical contact between the feedthrough metallization and a conductive layer on the surface of the recess is made at least partially through a sidewall 26 of the recess. In some cases, the electrical contact is formed at least partially through the thin membrane at the bottom of the recess, as well as through the sidewall of the recess. Isolation regions (e.g., $SiO_2$) 34 electrically separate the thermal pad 30 from the anode and cathode SMD contacts 32A, 32B. Bevel structures (e.g., v-grooves) can facilitate inspection of the sub-mount after soldering, for example, on a printed circuit board (PCB).

The non-planar via designs include a continuous layer of metal that serves multiple functions: (1) it conducts the current from the front-side (LED side) to the backside (SMD side) through the via, and (2) provides a sufficiently stable and reliable UBM for SMD soldering.

Figure 6:
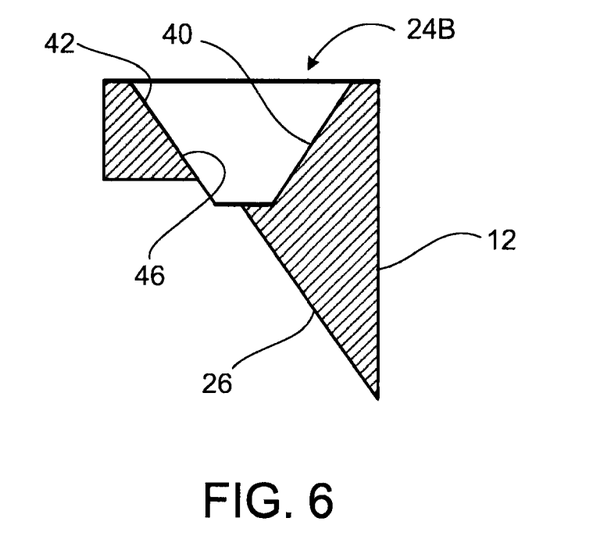
FIG. 6 is an enlarged cross-sectional view of a via structure of FIG. taken along lines P-P of FIG. 4.

According to some implementations, the design is achieved by structuring each UBM so that the UBM does not fully cover all the sidewall surfaces of each via that forms the front-to-backside interconnect. As shown in the example of FIG. 6, the via sidewall 40 furthest from the LED chip edge is substantially fully metallized. The bottom of the via structure 24B, which forms the actual interconnect between both sides of the substrate also is metallized. On the other hand, at least a portion 42 of the sidewall 46 opposite the sidewall 40 is left unmetallized. As illustrated in the example of FIG. 6, the portion 42 of the sidewall 46 closer to the wider end of the trapezoid-shaped via structure 24B (i.e., the portion of the sidewall closer to the back-side surface of the substrate 12) is not metallized. The feedthrough metallization in the via structures 24A, 24B for the other front-to-backside interconnects can have a similar design.

Figure 7:
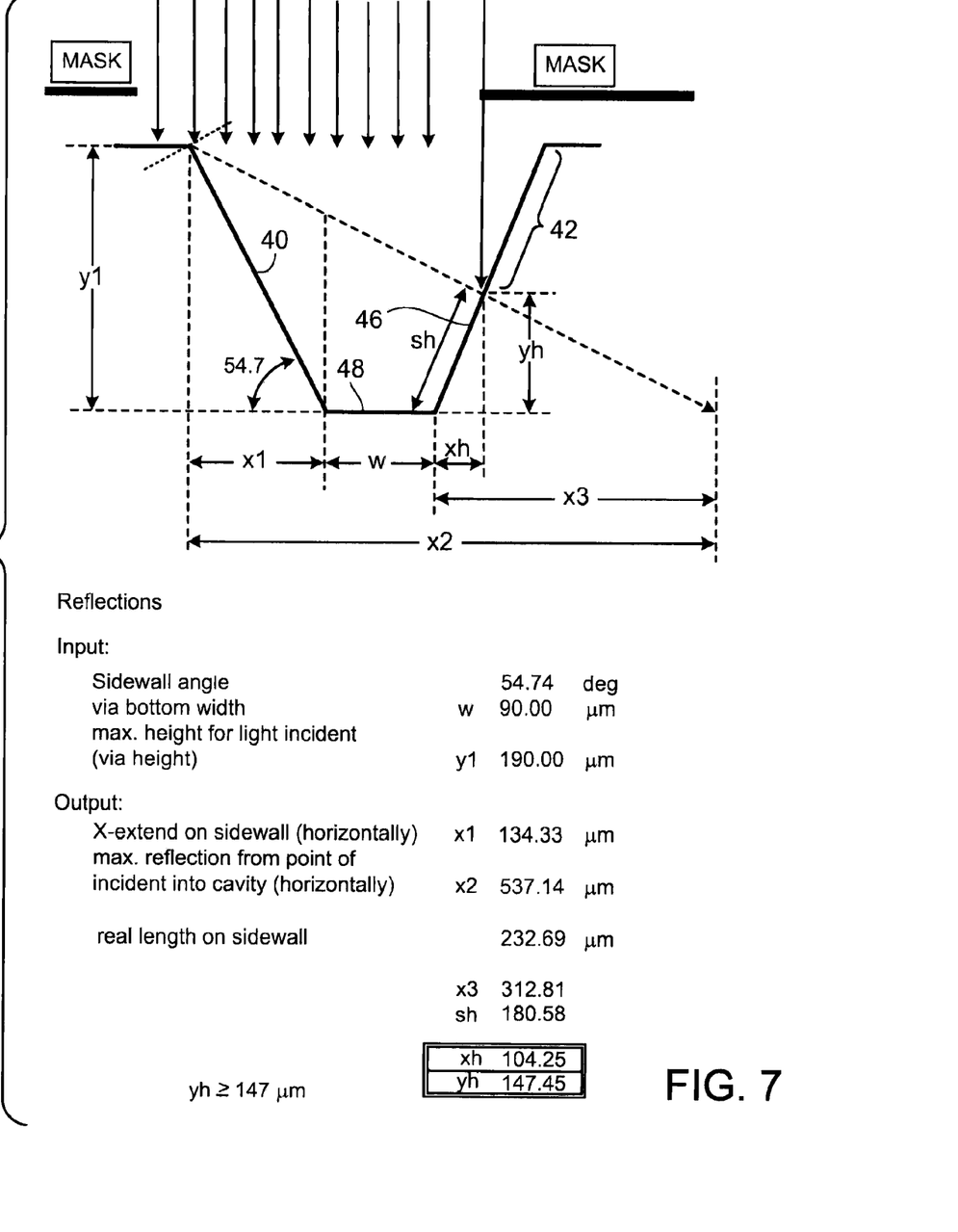
FIG. 7 illustrates schematically an example of optical reflections that may occur during photolithographic fabrication steps.

In some implementations, the height of the unmetallized portion 42 of the sidewall 46 may be limited by because of optical reflections that occur during photolithographic fabrication steps prior to deposition of the feedthrough metallization layer(s). FIG. 7 illustrates schematically how optical reflections during the photolithographic process may limit the height of the unmetallized portion 42 for a particular implementation having the specified dimensions. Optical reflections from the sidewall 40 may expose photoresist on a portion of the opposite wall 46. When the photoresist subsequently is developed, the photoresist on a portion of the sidewall 46 (i.e., the portion closer to the narrow end of the via structure 24B) will dissolve. Thus, when the feedthrough metallization subsequently is deposited, a portion of the sidewall 46 will become metallized along with the sidewall 40 and the bottom 48 of the via structure. Nevertheless, at least a portion 42 of the sidewall 46 remains unmetallized. In the illustrated example, approximately 20% to 25% of the sidewall 46 is unmetallized. In other implementations, greater or lesser sections of the sidewall are unmetallized.

Figure 8:
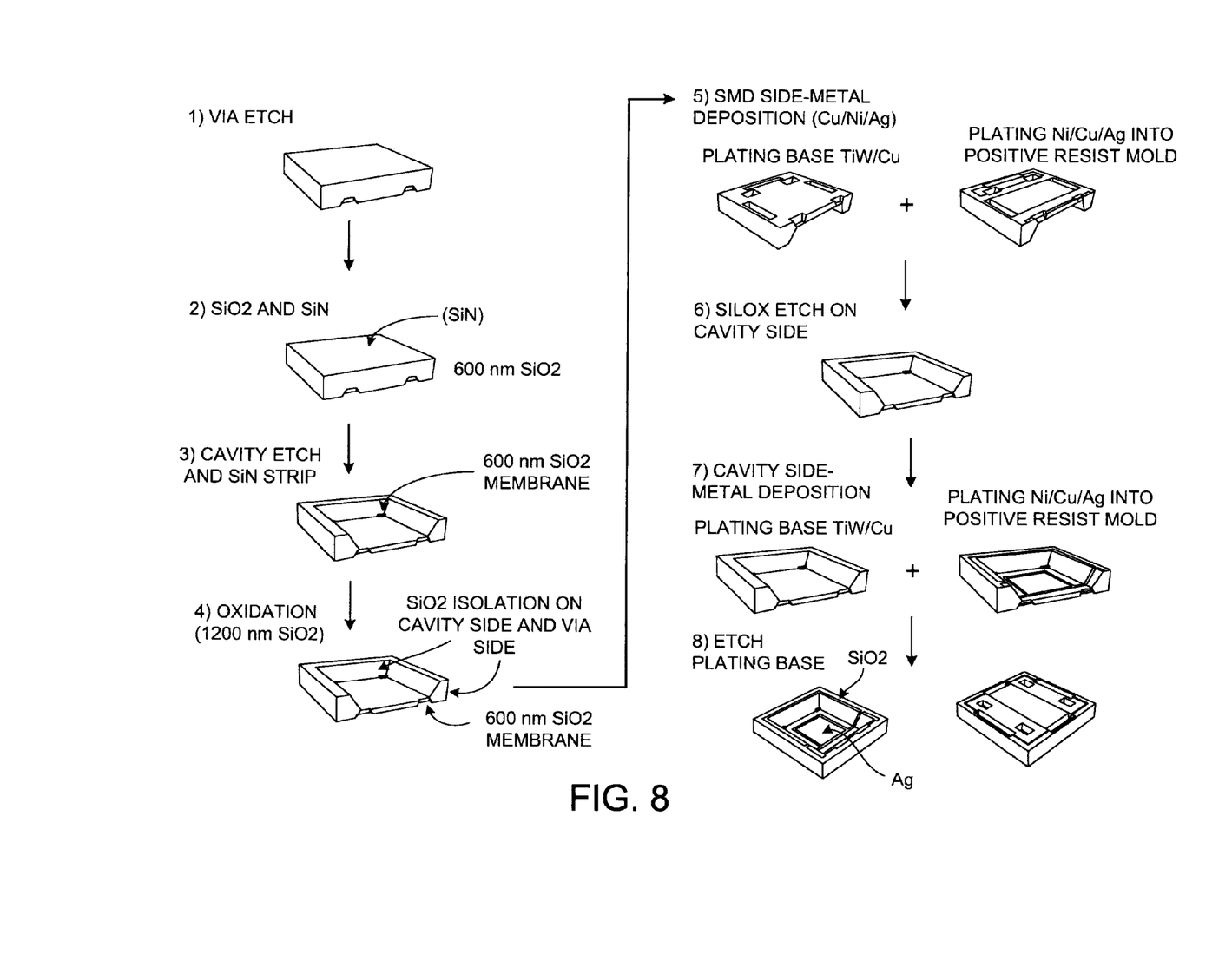
FIG. 8 is an example of a process flow for fabricating the sub-mount of FIG. 1.

An example of a process flow for fabricating a sub-mount using a silicon substrate is illustrated FIG. 8. The fabrication techniques can be applied on a wafer-level. The front-side recess and through-wafer interconnections can be provided, for example, using techniques described in U.S. Patent Publication No. 2008/0076195, the disclosure of which is incorporated herein by reference. Double-sided etching techniques can be used and include use of a sacrificial membrane (e.g., $SiO_2$) during formation of the through-wafer interconnections. According to a particular example, micro-vias are etched in the back-side (i.e., SMD-side) of a silicon wafer. An etch stop layer is provided over the back-side and covers surfaces in the micro-vias. A larger recess (i.e., cavity) is etched in the front-side (i.e., LED-side) of the wafer to a depth such that portions of the etch stop layer are exposed in the recess in areas where the micro-vias were etched. An isolation layer is deposited or grown over the exposed silicon, for example, by thermal oxidation. Metallization is deposited over one side of the wafer, and regions of the etch stop layer subsequently are removed from areas corresponding to where the micro-vias were etched. Metallization is deposited over the other side of the wafer so that the metallization deposited over the first side is in contact with the metallization deposited over the second side to form the through-wafer interconnections. In the illustrated example, the feedthrough metallization is formed of electroplated layers of metal. Electroplating is suitable because it provides thicker layers (with less thickness variation) of metal (e.g., from several μm to several tens of μm) that give the via structure added mechanical strength. Another advantage of electroplating is that through process tuning, a variation in surface roughness of silver can be obtained either to provide specular or diffuse reflection of the light emitted by the LED. Other implementations include metal layers deposited by PVD processes (e.g., sputter deposition or evaporation). Further details applicable in some implementations are shown in FIG. 8. Various steps may vary in other implementations.

Subsequent fabrication steps can include mounting an LED chip on the die attach pad 16, providing a wire bond connection from the LED chip to the cathode pad 20 and encapsulating the LED chip (e.g., with silicone). In some cases, a plastic or glass cup or reflector can be provided over the LED chip. The cup or reflector can contain optics for beam-shaping. The foregoing fabrication steps can be performed on the wafer scale or after the wafer has been diced into individual sub-mounts.

The foregoing design can help ensure that solder, which typically is provided in the form of solder paste from the PCB, does not fully enclose the volume defined by the via cavity when the LED package is mounted to a PCB. Consequently the flux contained in the solder can evaporate during the soldering process, and the solder is less likely to form voids. Thus, in some implementations, the foregoing design can help prevent excessive void formation in conjunction with non-planar SMD contacts, can help reduce reliability risks correlated to void formation and can provide a significant reduction in mask steps which leads to lower manufacturing costs and increased device yield.

Figure 9:
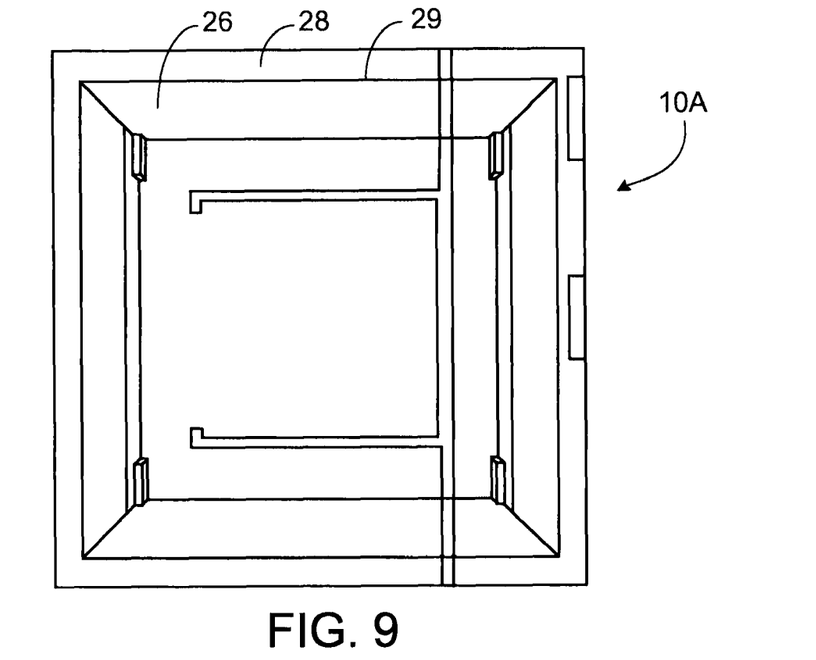
FIG. 9 is a top view of a sub-mount according to a second embodiment.
Figure 10:
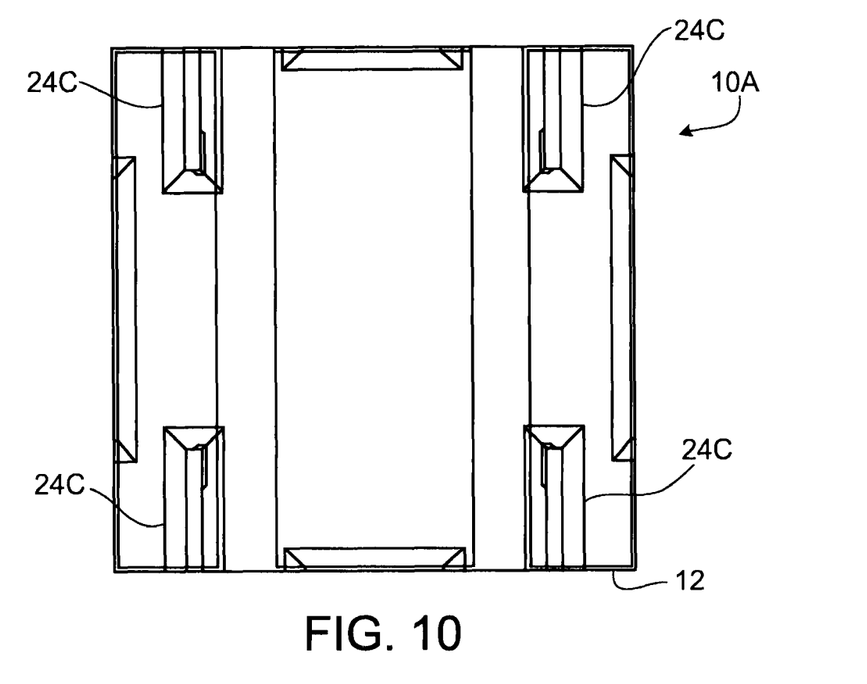
FIG. 10 is a bottom view of the sub-mount of FIG. 9.
Figure 11:
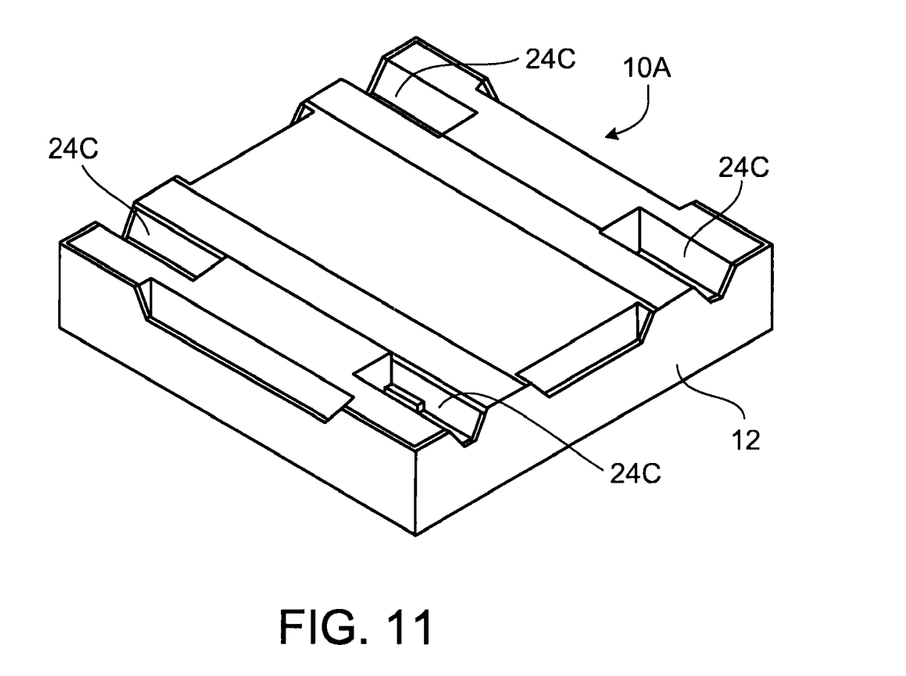
FIG. 11 is a front-side perspective view of the sub-mount of FIG. 9.
Figure 12:
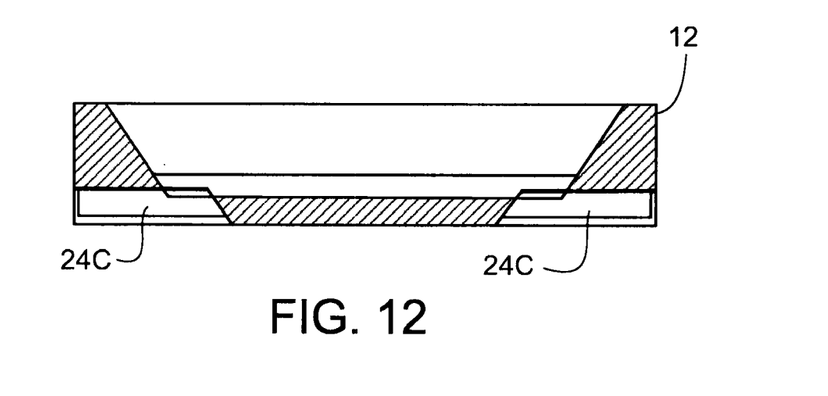
FIG. 12 is a cross-sectional view taken along lines M-M of FIG. 9.

According to another design, some or all of the foregoing advantages can be achieved by extending each via structure for the feedthrough metallization to a respective side edge of the sub-mount 12. FIGS. 9 and 10 illustrate, respectively, examples of the front and back sides of such a sub-mount 10A. Many features of this sub-mount are substantially the same as the sub-mount 10 in FIGS. 3 and 4. However, on the back side (i.e., the SMD-side) of the sub-mount, the via structures 24C for the feed-through metallization extend to the edge of the substrate 12. See also FIGS. 11 and 12. When mounting the LED package on a PCB, such a design allows the flux from the solder to flow out toward the sides so as to help prevent excessive void formation.

In some implementations, the mirror metallization on the sidewalls 26 of the recess in the LED-side stops slightly before the top surface of the package. In such implementations, the top flat surfaces 28 of the package (see FIGS. 1 and 9) would not be metallized, and the metallization on the sidewalls 26 of the recess would extend only to slightly below the boundary 29 between the top flat surfaces and the sidewalls. This feature can help ensure that encapsulant, which is provided in the recess for refractive index matching between the LED and air, completely covers the metallization within the recess. This, in turn, can reduce the likelihood that exposed metal will become galvanized in the event that the package is subject to moisture. For example, the electroplated metallization can include an adhesion layer (e.g., titanium (Ti) or chromium (Cr)) together with a plating base (e.g., gold (Au) or copper (Cu)). During operation (or reliability testing) of the LED package, moisture may condense on the package. If the metal stack is not covered by either solder (i.e., on the SMD side of the package) or encapsulant (i.e., on the LED side), the moisture can lead to a formation of a galvanic element because of the presence of silver (Ag) and a less noble metal (e.g., Ti, Cr or Cu). In particular, if the LED-side metallization is not protected by the encapsulant, moisture on the sidewalls can cause the less noble metal to dissolve and the metallization to delaminate.

Other implementations are within the scope of the claims.

What is claimed is:

1. A sub-mount for an optoelectronic device comprising:
a silicon substrate having a front-side surface and a back-side surface, the substrate having a recess defined in its front-side, wherein the front-side surface and the back-side surface extend between side edges of the silicon substrate;
electrical contact pads disposed on a bottom surface of the recess, and a die attach pad on which to mount the optoelectronic device, wherein the die attach pad is disposed on the bottom surface of the recess; and
feedthrough metallization in via structures, each of the via structures extending through the substrate from the bottom surface of the recess to the back-side surface of the substrate, wherein the feedthrough metallization in the via structures electrically couples the contact pads disposed within the recess to respective contact pads on the back-side surface of the substrate;
wherein one via structure from the via structures has a sidewall extending through the silicon substrate from the bottom surface of the recess to the back-side surface of the silicon substrate, wherein the sidewall includes a first portion covered with the feedthrough metallization and a second portion that is without the feedthrough metallization, wherein the feedthrough metallization covering the first portion of the sidewall extends distally toward the back-side surface and includes a distal most end surface that is spaced from the back-side surface toward the front-side surface, wherein the distal most end surface of the feedthrough metallization covering the first portion of the sidewall is positioned within the one via structure, wherein the sidewall of the one via structure extends continuously to one of the side edges of the silicon substrate such that the one via structure is exposed at said side edge of the silicon substrate.

2. The sub-mount of claim 1 wherein the one via-structure has a cross-section that is trapezoid-shaped.

3. The sub-mount of claim 1 wherein the one via structure has a narrower open end and a wider open end, and wherein the second portion of the at least one sidewall is adjacent the wider opening.

4. The sub-mount of claim 1 wherein the one via structure includes a metallized sidewall opposite the sidewall, and wherein the metallized sidewall is further from the die attach pad than the sidewall.

5. The sub-mount of claim 1 wherein the sidewall is sloped, and wherein the second portion of the sidewall is adjacent the back-side surface of the substrate.

6. The sub-mount of claim 1 wherein the feedthrough metallization comprises layers of electroplated metal.

7. The sub-mount of claim 1 wherein the electrical contact pads on the bottom surface of the recess include an anode pad and a cathode pad, and wherein the sub-mount includes a plurality of via structures with feedthrough metallization coupled to the anode pad and a plurality of via structures with feedthrough metallization coupled to the cathode pad.

8. The sub-mount of claim 1 wherein the contact pads on the back-side surface of the substrate comprise SMD metal pads.

9. The sub-mount of claim 8 mounted to a printed circuit board.

10. The sub-mount of claim 1 wherein the sidewall has about 20% to about 25% of its surface unmetallized.

11. The sub-mount of claim 1 including metallization substantially covering sidewalls of the recess, wherein the metallization extends only to slightly below a boundary between the sidewalls of the recess and top flat surfaces on the front-side surface of the substrate.

12. The sub-mount of claim 1 wherein the sidewall is positioned closer to the die attach pad than any other sidewall for each via.

13. A sub-mount for an optoelectronic device comprising:
a silicon substrate having a front-side surface, a back-side surface, and side edges, the substrate having a recess defined in its front-side, wherein the front-side surface and the back-side surface extend between the side edges of the silicon substrate;
electrical contact pads disposed on a bottom surface of the recess, and a die attach pad on which to mount the optoelectronic device, wherein the die attach pad is disposed on the bottom surface of the recess; and
feedthrough metallization in via structures, each of the via structures extending through the substrate from the surface defining a bottom of the recess to the back-side surface, wherein the feedthrough metallization in the via structures electrically couples the contact pads disposed within the recess to respective contact pads on the back-side surface of the substrate;
wherein one via structure from the via structures has a sidewall extending through the silicon substrate from the bottom surface of the recess to the back-side surface of the silicon substrate, wherein the sidewall includes a first portion covered with the feedthrough metallization, and wherein the one via structure does not include another sidewall directly opposing the sidewall such that the one via structure extends continuously to one of the side edges of the silicon substrate.

14. The sub-mount of claim 13 wherein the electrical contact pads on the bottom surface of the recess include an anode pad and a cathode pad, and wherein the sub-mount includes a plurality of via structures with feedthrough metallization coupled to the anode pad and a plurality of via structures with feedthrough metallization coupled to the cathode pad.

15. The sub-mount of claim 13 wherein the contact pads on the back-side surface of the substrate comprise SMD pads.

16. The sub-mount of claim 15 mounted to a printed circuit board.

17. The sub-mount of claim 13 wherein the sidewall is substantially covered with the feedthrough metallization.

18. The sub-mount of claim 17 wherein the first portion is positioned closer to the a front-side surface than a second portion of the sidewall.

19. The sub-mount of claim 13, wherein the one via structure includes:
a first opening at the bottom surface of the recess on the front-side surface of the silicon substrate;
a second opening at the back-side surface of the silicon substrate; and
a third opening at the one of the side edges that the one via structure extends continuously thereto, wherein the first, second, and third openings are different from each other.

20. A method comprising:
mounting a LED chip to a sub-mount as defined in any one of claims 1-16;
encapsulating the LED chip; and
mounting the sub-mount to a printed circuit board, wherein mounting the sub-mount to the printed circuit board includes soldering the contact pads on the back-side surface of the substrate to the printed circuit board.

* * * * *